United States Patent
Cheng et al.

(10) Patent No.: US 11,156,661 B2
(45) Date of Patent: Oct. 26, 2021

(54) REVERSIBLE MULTI-BIT SCAN CELL-BASED SCAN CHAINS FOR IMPROVING CHAIN DIAGNOSTIC RESOLUTION

(71) Applicant: Mentor Graphics Corporation, Wilsonville, OR (US)

(72) Inventors: Wu-Tung Cheng, Lake Oswego, OR (US); Szczepan Urban, Gowarzewo (PL); Jakub Janicki, Poznan (PL); Manish Sharma, Wilsonville, OR (US); Yu Huang, West Linn, OR (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 16/933,359

(22) Filed: Jul. 20, 2020

(65) Prior Publication Data

US 2021/0033669 A1 Feb. 4, 2021

Related U.S. Application Data

(60) Provisional application No. 62/879,589, filed on Jul. 29, 2019.

(51) Int. Cl.
*G01R 31/3177* (2006.01)
*G01R 31/3185* (2006.01)

(52) U.S. Cl.
CPC . *G01R 31/3177* (2013.01); *G01R 31/318536* (2013.01); *G01R 31/318541* (2013.01)

(58) Field of Classification Search
CPC ........ G01R 31/3177; G01R 31/318541; G01R 31/318536
USPC ................................ 714/726, 729, 727, 731
See application file for complete search history.

(56) References Cited

U.S. PATENT DOCUMENTS

| | | | | |
|---|---|---|---|---|
| 9,222,978 B2* | 12/2015 | Huang | ........... | G01R 31/318544 |
| 10,156,607 B2* | 12/2018 | Goel | .............. | G01R 31/318536 |
| 2009/0089637 A1* | 4/2009 | Jun | ................ | G01R 31/318541 |
| | | | | 714/729 |
| 2012/0008731 A1* | 1/2012 | Hsu | ...................... | G09G 3/3674 |
| | | | | 377/79 |

(Continued)

OTHER PUBLICATIONS

Huang et al., Reversible Scan Based Diagnostic Patterns, 2019, IEEE, pp. 1-4. (Year: 2019).*

(Continued)

*Primary Examiner* — John J Tabone, Jr.

(57) ABSTRACT

A circuit comprises a scan chain comprising one or more multi-bit flip-flops, a plurality of multiplexers, and new scan enable signal generation circuitry. Each of the plurality of multiplexers is associated with a particular bit of the one or more multi-bit flip-flops with an output of the each of the plurality of multiplexers coupled to a data input of the particular bit, which is configured to select, based on a scan direction control signal, between an input signal from functional circuitry of the circuit and an input signal from a data output of a bit of the scan chain immediately following the particular bit in a normal scan shift direction. The new scan enable signal generation circuitry is configured to generate a new scan enable signal for the one or more multi-bit flip-flops based on the scan direction control signal and a scan enable signal for the scan chain.

20 Claims, 11 Drawing Sheets

(56) References Cited

U.S. PATENT DOCUMENTS

| | | | | |
|---|---|---|---|---|
| 2014/0223247 A1* | 8/2014 | Rajski | ............ | G01R 31/318563 |
| | | | | 714/726 |
| 2014/0298128 A1* | 10/2014 | Maliuk | ............ | G01R 31/31727 |
| | | | | 714/731 |
| 2017/0307683 A1* | 10/2017 | Goel | .............. | G01R 31/318541 |
| 2020/0333398 A1* | 10/2020 | Huang | ........... | G01R 31/318544 |
| 2020/0341057 A1* | 10/2020 | Cheng | ................... | G06F 30/333 |

OTHER PUBLICATIONS

Anonymous, "Bidirectional Scan Chain for Digital Circuit Testing", IP.com, Nov. 21, 2007, pp. 1-5.

Peilin Song et al., "A Novel Scan Chain Diagnostics Technique Based on Light Emission from Leakage Current", IEEE International Test Conference 2004, Paper 6.2, 2004, pp. 140-147.

Kapoor et al., "Using multi-bit flip-flop custom cells to achieve better SoC design efficiency," Aug. 20, 2014, https://www.embedded.com/using-multi-bit-flip-flop-custom-cells-to-achieve-better-soc-design-efficiency/, pp. 1-5.

* cited by examiner

| | First Mode | | Second Mode | |
|---|---|---|---|---|
| First signal 645 | 1 | 1 | 0 | 0 |
| Second signal 655 | 1 | 0 | 1 | 0 |
| Scan Enable 665 | 1 (Capture) | 0 (Shift) | 0 (Shift) | 0 (Shift) |
| Scan Direction 675 | 1 (Left) | 1 (Left) | 1 (Left) | 0 (Right) |

REVERSIBLE MULTI-BIT SCAN CELL-BASED SCAN CHAINS FOR IMPROVING CHAIN DIAGNOSTIC RESOLUTION

RELATED APPLICATIONS

This application claims the benefit of U.S. Provisional Patent Application No. 62/879,589, filed on Jul. 29, 2019, which application is incorporated entirely herein by reference.

FIELD OF THE DISCLOSED TECHNIQUES

The presently disclosed techniques relates to circuit testing. Various implementations of the disclosed techniques may be particularly useful for scan chain diagnosis.

BACKGROUND OF THE DISCLOSED TECHNIQUES

Building circuits on silicon as test chips can provide insight into how a new fabrication process works. Traditionally, semiconductor manufacturers relied mainly on SRAM (static random-access memory) test chips for ramping up, qualifying and monitoring new semiconductor fabrication processes. The transistor and circuit geometries used on an SRAM test chip, however, represent only a small fraction of the transistor and circuit geometries found in a real product. In recent years, test chips with logic circuit components (logic test chips hereinafter) are often utilized to supplement or replace SRAM test chips. While more closely representing chips with real circuit designs, the logic test chips are not as easily testable or diagnosable as the SRAM test chips.

To check whether a logic test chip is fabricated according to the design and to locate potential defects, scan testing is usually employed. In this technique, a series of known values (test stimuli or test pattern) are shifted-in (or loaded into) state elements called scan cells through their sequential inputs. These scan cells are interconnected into scan chains for scan testing. The shifting-in occurs by placing the integrated circuit in a special mode, known as shift mode, and then applying a series of clock pulses, called "shift pulses" or "shift clock pulses." Each shift clock pulse pushes a bit of test stimuli into a scan cell in each of the scan chains. This continues until all scan cells in the scan chains are filled with test pattern bits. Then, one or more clock pulses, called "capture pulses" or "capture clock pulses," are applied to the circuit as they would be in normal operation. This is referred to as capture mode. After the test pattern bits are injected into the circuit, the results of the test (test responses) are "captured" and stored in the scan cells. The circuit then returns to shift mode, and with each additional clock pulse, a bit of the test responses is pushed or shifted out as each bit of new test pattern is pushed or shifted in. The shifted out test responses are then compared with expected results to determine and locate any errors. Shift mode and capture mode together may be called as test mode.

Scan chains and their associated clock circuitry are themselves a major source of circuit failures. It has been reported that defects occurring on scan chains account for about 30% to 50% of all failing chips. Thus, scan chains need to be tested and diagnosed first. As discussed in detail below, faulty scan chains can be detected using relatively simple methods. Locating defective scan cells, however, are challenging. Physical failure analysis instruments, combined with a tester, are sometimes used to search for defective responses along scan chains. These hardware-based methods often rely on specially-designed scan chains and scan cells. While effective in isolating scan chain defects, the requirement of extra hardware may not be acceptable in many realistic products. Further, it is difficult to apply these methods to chips with embedded compression circuits without resorting to a bypass mode.

Software-based techniques use algorithmic diagnosis procedures to identify failing scan cells. It may run chain diagnosis with conventional scan chains with or without embedded compressions. The current software-based chain diagnosis techniques may be further classified into two categories: model-based algorithms and data-driven algorithms. In a model-based chain diagnosis process, fault models and pattern simulation are used. In a data-driven chain diagnosis process, signal profiling, filtering and edge detections are applied. Each category of algorithms has its own advantages and disadvantages. These two can also be combined to increase diagnosis resolution and accuracy. While conventional methods may achieve satisfactory results for a defect behaving exactly like a modeled fault (e.g. stuck-at-0 fault at a scan cell's output), a defect in a scan chain often exhibits un-modeled faulty behavior (e.g. intermittent faulty behavior). For the un-modeled faults, both the diagnostic accuracy and resolution could degrade significantly.

Using bidirectional scan chains (or reversible scan chains) to improve the chain diagnostic accuracy and resolution was first proposed by P. Song, "A New Scan Structure for Improving Scan Chain Diagnosis and Delay Fault Coverage," Proc. 9th IEEE North Atlantic Test Workshop (NATW), 2000, pp. 14-18. A similar technique was discussed by a paper published by Ip.com on Nov. 21, 2007, entitled "Bidirectional Scan Chain for Digital Circuit Testing." U.S. Pat. Nos. 9,222,978 and 10,156,607 also disclosed both forward and backward scan tests via reversible scan chains. In a bidirectional or reversible scan chain architecture, the scan chains can change shift direction between loading and unloading chain patterns (flush patterns). This, coupled with carefully designed chain patterns and diagnostic algorithms, can significantly reduce the number of defective scan cell suspects. The suspects may even be narrowed down on layout in some cases.

Recently, the multi-bit flip-flop (MBFF) technique was introduced as a method for reducing the power consumption and chip area of integrated circuits (ICs) during the physical implementation stage of their development process. This technique merges single flip-flops into multi-bit flip-flops. Each multi-bit flip-flop has one scan input and one scan output. Scan chains including multi-bit flip-flops can employ an existing bidirectional scan technique by treating each multi-bit flip-flop as a single unit. However, diagnostic resolution would suffer because the existing bidirectional scan technique has to report all bits of a multi-bit flip-flop as suspects if the multi-bit flip-flop is a suspect.

BRIEF SUMMARY OF THE DISCLOSED TECHNIQUES

Various aspects of the disclosed technology relate to scan architecture comprising multi-bit flip-flops capable of bi-directional scan shifting. In one aspect, there is a circuit, comprising: a scan chain comprising one or more multi-bit flip-flops; a plurality of multiplexers, each of the plurality of multiplexers being associated with a particular bit of the one or more multi-bit flip-flops with an output of the each of the plurality of multiplexers coupled to a data input of the particular bit, the each of the plurality of multiplexer configured to select, based on a scan direction control signal, between an input signal from functional circuitry of the circuit and an input signal from a data output of a bit of the scan chain immediately following the particular bit in a normal scan shift direction; and new scan enable signal generation circuitry configured to generate a new scan enable signal for the one or more multi-bit flip-flops based on the scan direction control signal and a scan enable signal for the scan chain, wherein the one or more multi-bit flip-flops perform a capture operation when both the scan enable signal and the new scan enable signal are set to be a first logic value and the scan direction control signal is set to be a second logic value, a scan shift operation in the normal scan shift direction when both the scan enable signal and the new scan enable signal are set to be a third logic value which is opposite to the first logic value and the scan direction control signal is set to be the second logic value, and a scan shift operation in a direction opposite to the normal scan shift direction when the scan enable signal and the new scan enable signal are set to be the third logic value and the first logic value, respectively and the scan direction control signal is set to be a fourth logic value which is opposite to the second logic value.

The new scan enable signal generation circuitry may comprise an AND gate, and wherein the first logic value is opposite to the second signal. Alternatively, the new scan enable signal generation circuitry may comprise an AND gate and an inverter, an input and an output of the inverter being coupled to the scan direction control signal and an input of the AND gate, respectively, and wherein the first logic value is the same as the second signal. Still alternatively, the new scan enable signal generation circuitry may comprise an XOR gate and an inverter, an input and an output of the inverter being coupled to the scan enable signal and an input of the XOR gate, respectively, and wherein the first logic value is opposite to the second logic value.

The scan chain may further comprise one or more single-bit flip-flops, an scan input and a scan enable input of each of the one or more single-bit flip-flops being coupled to an output of a multiplexer and the scan enable signal, respectively, and a selection input of the multiplexer being coupled to the scan direction control signal.

The scan chain further comprises one or more single-bit flip-flops, a data input and a scan enable input of each of the one or more single-bit flip-flops being coupled to an output of a multiplexer and the new scan enable signal, respectively, and a selection input of the multiplexer being coupled to the scan direction control signal.

The circuit may further comprise pin-sharing circuitry with two inputs coupled to a input pin for the functional circuitry and the scan enable signal, respectively, the pin-sharing circuitry configured to output a particular logic value during the capture operation and to allow a signal from the input pin for the functional circuitry pass through as the scan direction control signal during a scan shift operation. The pin-sharing circuitry may comprise an AND gate.

Alternatively, the circuit may further comprise a register configured to store a first signal, the first signal determining whether the plurality of scan chains operate in a first mode or a second mode, wherein the scan chain operating in the first mode is configured to perform, based on a second signal, either the scan shift operation in the normal scan shift direction or the capture operation, and wherein the scan chain operating in the second mode is configured to perform, based on the second signal, the scan shift operation in either the normal scan shift direction or the direction opposite to the normal scan shift direction. The first signal may be delivered to the register through a network conforming to IEEE 1687-2014 (IJTAG) and the second signal may be supplied through an input pin of the circuit.

In another aspect, there is one or more computer-readable media storing computer-executable instructions for causing a computer to perform a method for creating test circuitry in a circuit design for testing a chip fabricated according to the circuit design, the test circuitry comprising: a scan chain comprising one or more multi-bit flip-flops; a plurality of multiplexers, each of the plurality of multiplexers being associated with a particular bit of the one or more multi-bit flip-flops with an output of the each of the plurality of multiplexers coupled to a data input of the particular bit, the each of the plurality of multiplexer configured to select, based on a scan direction control signal, between an input signal from functional circuitry of the circuit and an input signal from a data output of a bit of the scan chain immediately following the particular bit in a normal scan shift direction; and new scan enable signal generation circuitry configured to generate a new scan enable signal for the one or more multi-bit flip-flops based on the scan direction control signal and a scan enable signal for the scan chain, wherein the one or more multi-bit flip-flops perform a capture operation when both the scan enable signal and the new scan enable signal are set to be a first logic value and the scan direction control signal is set to be a second logic value, a scan shift operation in the normal scan shift direction when both the scan enable signal and the new scan enable signal are set to be a third logic value which is opposite to the first logic value and the scan direction control signal is set to be the second logic value, and a scan shift operation in a direction opposite to the normal scan shift direction when the scan enable signal and the new scan enable signal are set to be the third logic value and the first logic value, respectively and the scan direction control signal is set to be a fourth logic value which is opposite to the second logic value.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

Figure 1:
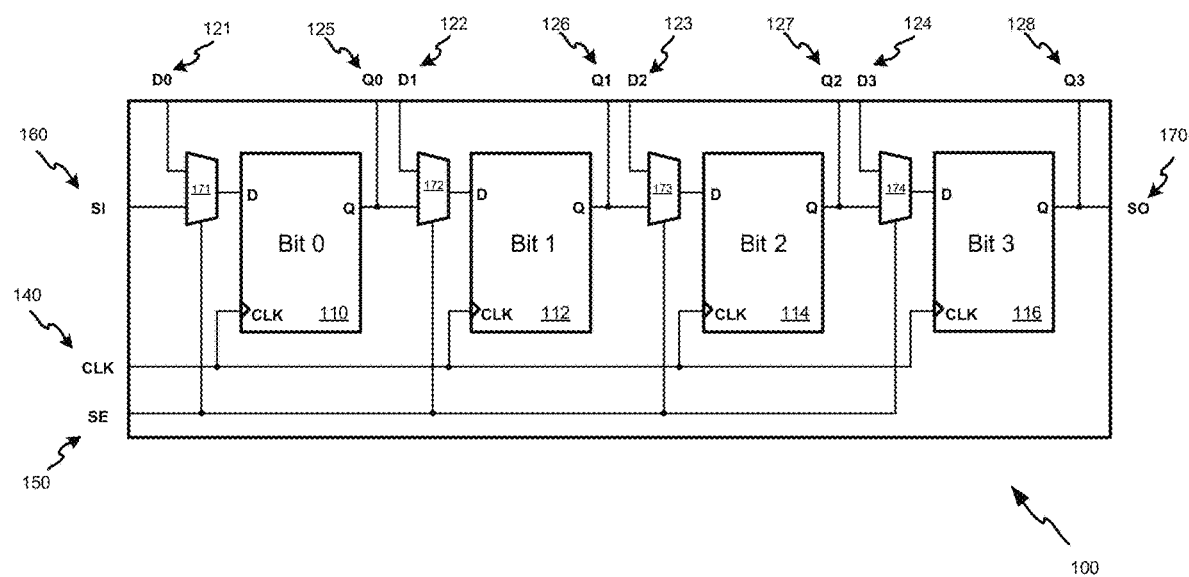
FIG. 1 illustrates an example of a block diagram for a four-bit flip-flop.

Various aspects of the disclosed technology relate to scan architecture comprising multi-bit flip-flops capable of bi-directional scan shifting. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "couple" and "generate" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is an error caused in a device during the manufacturing process. A fault model is a description of how a defect alters design behavior. In another word, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file, or failure report). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Diagnosis includes logic diagnosis (sometimes referred to as scan diagnosis or diagnosis) and chain diagnosis. Logic diagnosis may employ a fault dictionary or directly examine the syndrome (i.e., the effect) of the failing chip to determine likely defect locations (defect suspects). The latter approach may include structural pruning (backtracing), fault injection, and evaluation (fault simulation for both failing and passing test patterns). The quality of diagnosis can be measured by diagnostic resolution (the number of the real defects vs. the number of the defect suspects). Diagnostic resolution is linked not only to the algorithm used for diagnosis but also to the test patterns used for the manufacturing test (manufacturing test patterns). To enhance the diagnosis quality, a diagnostic test pattern generation process may be employed. This process generates test patterns that can refine the set of defect suspects.

Chain diagnosis determines scan cells that are likely to be defective. In a chain diagnosis process, two types of test patterns may be used. The first type is called chain patterns. A chain pattern is a pattern used in a process comprising shift-in and shift-out without pulsing capture clocks. The other type is often referred to as scan patterns. A scan pattern is a pattern used in a process comprising shift-in, one or multiple capture clock cycles, and shift-out, and the scan patterns include patterns generated by ATPG for testing system logic, special chain diagnostic patterns generated only for scan chain diagnosis purpose and some special functional patterns. Chain patterns can be used to test the integrity of scan chains and/or determine fault models associated with faulty scan chains while scan patterns can be used to inject certain values to some scan cells for locating defective scan cells.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can reduce not only the amount of data stored on the tester but also the test time for a given test data bandwidth.

All of the above mentioned processes, design insertion for testing, test pattern generation, and logic diagnosis, can be performed by various electronic design automation tools such as those in the Tessent family of software tools available from Mentor Graphics Corporation, Wilsonville, Oreg.

Using multi-bit flip-flops to replace single-bit flip-flops enables optimization of power, area, and timing. FIG. 1 illustrates an example of a block diagram for a four-bit flip-flop 100. Four built-in flip-flops 110, 112, 114 and 116 in the four-bit flip-flop 100 share a common clock 140 and a scan enable signal 150. Each of the built-in flip-flops 110, 112, 114, and 116 has a data input (sometimes referred to as parallel input, 121, 122, 123, and 124) and a data output (sometimes referred to as parallel output, 125, 126, 127, and 128). The four-bit flip-flop 100 has a scan input port 160 and a scan output port 170. The scan enable signal 150 controls, via four multiplexers 171, 172, 173, and 174, whether the built-in flip-flops 110, 112, 114, and 116 operate in a scan shift mode or not. The scan shift direction is from left to right: from the scan input port 160 to the built-in flip-flop 121, then to the built-in flip-flop 122, then to the built-in flip-flop 123, then to the built-in flip-flop 124, and finally to the scan output port 170.

One major structural difference between multiple single-bit flip-flops and a multi-bit flip-flop is the shared clock network. All of the single-bit elements in a multi-bit flip-flop are physically placed nearby, which not only resolves many physical design implementation challenges, but also leads to a smaller number of clock sinks and thus smaller silicon area. The overall capacitance driven by a clock net is also reduced, resulting in less power consumption. The power consumption of a circuit typically has three elements: dynamic power, leakage power, and short-circuit power. Dynamic power is the major power source and clock network power is the dominating source of dynamic power due to high switching of the clock signal. A small impact on clock network power can reduce the total power significantly. In addition, the multi-bit flip-flop design can reduce clock skew in sequential gates as the clock paths are balanced internally.

Figure 2:
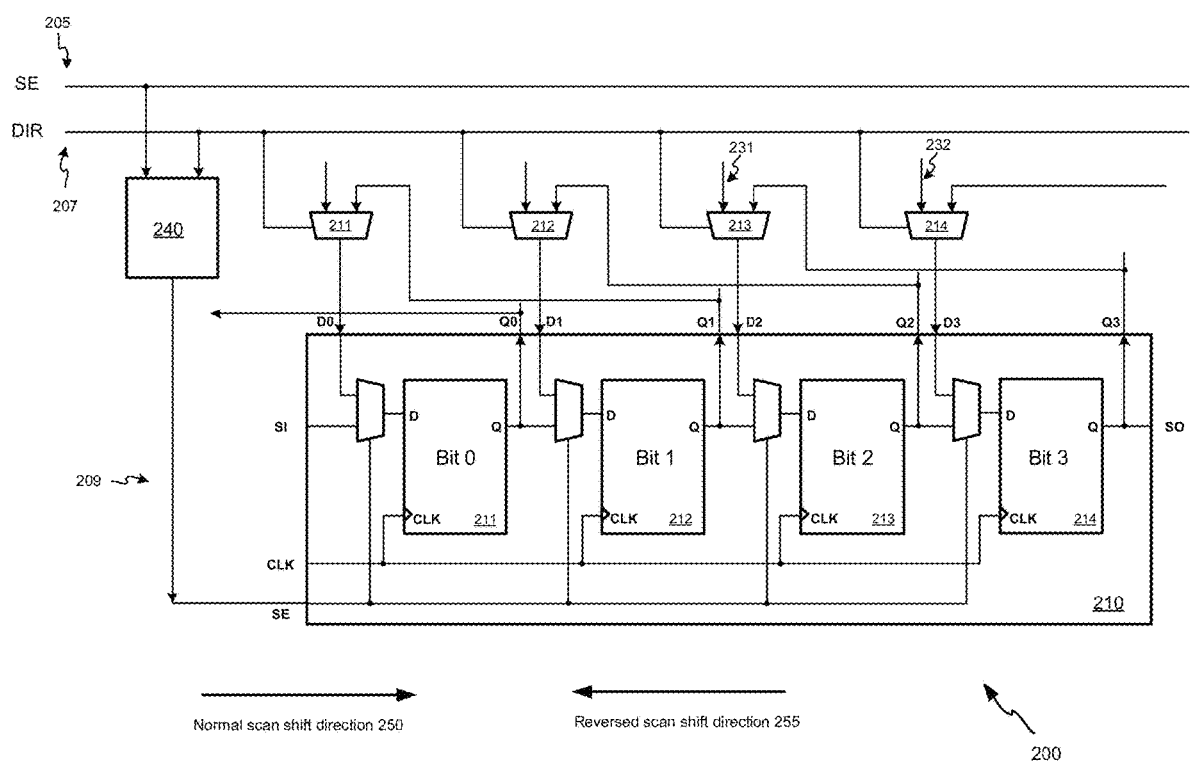
FIG. 2 illustrates an example of a block diagram of part of a scan chain comprising a four-bit flip-flop which is configured to perform bidirectional scan shift operations according to various examples of the disclosed technology.

FIG. 2 illustrates an example of a block diagram of part of a scan chain 200 comprising a four-bit flip-flop 210 which is configured to perform bidirectional scan shift operations according to various examples of the disclosed technology. In the setup, four multiplexers 211, 212, 213, and 214 are coupled to the four-bit flip-flop 210 with their outputs coupled the data inputs of four bits 211, 212, 213 and 214, respectively. Each of the four multiplexers 211, 212, 213, and 214 selects, based on a scan direction control signal 207, between an input signal from functional circuitry of the circuit and an input signal from a data output of a bit of the scan chain immediately following the particular bit in a normal scan shift direction 250. For example, the multiplexer 213 selects between an input signal 231 from functional circuitry and the data output signal from the bit 214 to be the data input signal for the bit 213 because the bit 214 is the next bit following the bit 213. As for the multiplexer 214, two inputs are an input signal 232 from the functional circuitry and the data output signal from a data output of a bit outside of the four-bit flip-flop 210, which can be a single-bit flip-flop or the first bit of another multi-bit flip-flop. It should be noted that the multiplexers 211, 212, 213, and 214 are not limited to a particular type of multiplexers, and a person of ordinary skill in the art would appreciate that any circuit configurable to perform the function may be employed.

The scan chain 200 also comprises new scan enable signal generation circuitry 240. The new scan enable signal generation circuitry 240 is configured to generate, based on the scan direction control signal 207 and a scan enable signal 205 for the scan chain 200, a new scan enable signal 209 for the four-bit flip-flop 210 and any other multi-bit flip-flops on the scan chain 200. The four-bit flip-flop 210 can perform a capture operation when both the scan enable signal 205 and the new scan enable signal 209 are set to be a first logic value and the scan direction control signal 207 is set to be a second logic value. And the four-bit flip-flop 210 can perform a scan shift operation in the normal scan shift direction when both the scan enable signal 205 and the new scan enable signal 209 are set to be a third logic value which is opposite to the first logic value and the scan direction control signal 207 is set to be the second logic value, or a scan shift operation in a direction opposite to the normal scan shift direction when the scan enable signal 205 and the new scan enable signal 209 are set to be the third logic value and the first logic value, respectively and the scan direction control signal 207 is set to be a fourth logic value which is opposite to the second logic value.

Figure 3A:
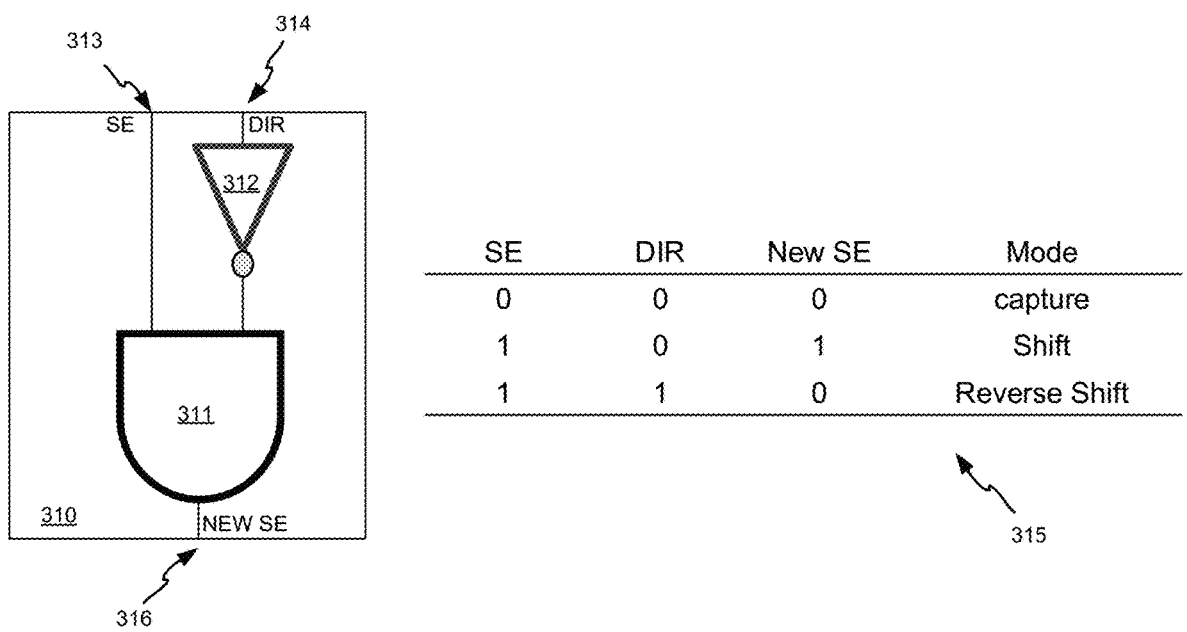
FIG. 3A illustrates an example of a block diagram of new scan enable signal generation circuitry and the corresponding truth table according to various examples of the disclosed technology.

The new scan enable signal generation circuitry 240 can be implemented in various configurations. FIG. 3A illustrates an example of a block diagram of new scan enable signal generation circuitry 310 and the corresponding truth table 315 according to various examples of the disclosed technology. The new scan enable signal generation circuitry 310 comprises an AND gate 311 and an inverter 312. A scan direction control signal 314 is first inverted by the inverter 312 and then is combined with a scan enable signal 313 by the AND gate 311 to generate a new scan enable signal 316. When both the scan enable signal 313 and the scan direction control signal 314 are set to be "0", the new scan enable signal 316 has a value of "0" and a multi-bit flip-flop using the new scan enable signal 316 as its scan enable signal performs a capture operation. When the scan enable signal 313 and the scan direction control signal 314 are set to be "1" and "0", respectively, the new scan enable signal 316 has a value of "1" and a multi-bit flip-flop using the new scan enable signal 316 as its scan enable signal performs a scan shift operation in the normal scan shift direction. When both the scan enable signal 313 and the scan direction control signal 314 are set to be "1", the new scan enable signal 316 has a value of "0" and a multi-bit flip-flop using the new scan enable signal 316 as its scan enable signal performs a scan shift operation in a direction opposite to the normal scan shift direction.

Figure 3B:
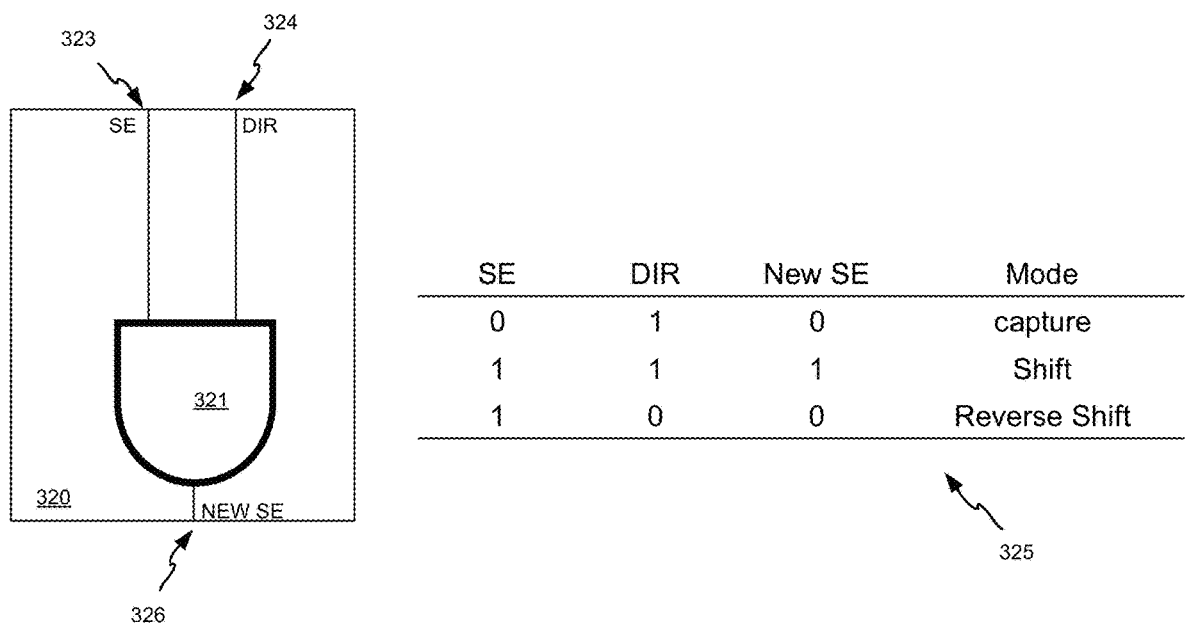
FIG. 3B illustrates an example of a block diagram of another new scan enable signal generation circuitry and the corresponding truth table according to various examples of the disclosed technology.

FIG. 3B illustrates an example of a block diagram of another new scan enable signal generation circuitry 320 and the corresponding truth table 325 according to various examples of the disclosed technology. The new scan enable signal generation circuitry 320 comprises an AND gate 321. A scan direction control signal 324 is combined with a scan enable signal 323 by the AND gate 321 to generate a new scan enable signal 326. When the scan enable signal 323 and the scan direction control signal 324 are set to be "0" and "1", respectively, the new scan enable signal 326 has a value of "0" and a multi-bit flip-flop using the new scan enable signal 326 as its scan enable signal performs a capture operation. When both the scan enable signal 323 and the scan direction control signal 324 are set to be "1", the new scan enable signal 326 has a value of "1" and a multi-bit flip-flop using the new scan enable signal 326 as its scan enable signal performs a scan shift operation in the normal scan shift direction. When both the scan enable signal 323 and the scan direction control signal 324 are set to be "1" and "0", respectively, the new scan enable signal 326 has a value of "0" and a multi-bit flip-flop using the new scan enable signal 326 as its scan enable signal performs a scan shift operation in a direction opposite to the normal scan shift direction.

Figure 3C:
FIG. 3C illustrates an example of a block diagram of still another new scan enable signal generation circuitry and the corresponding truth table according to various examples of the disclosed technology.

FIG. 3C illustrates an example of a block diagram of still another new scan enable signal generation circuitry 330 and the corresponding truth table 335 according to various examples of the disclosed technology. The new scan enable signal generation circuitry 330 comprises an XOR gate 331 and an inverter 332. A scan enable signal 333 is first inverted by the inverter 332 and then is combined with a scan direction control signal 334 by the XOR gate 331 to generate a new scan enable signal 336. When the scan enable signal 333 and the scan direction control signal 334 are set to be "0" and "1", respectively, the new scan enable signal 336 has a value of "0" and a multi-bit flip-flop using the new scan enable signal 336 as its scan enable signal performs a capture operation. When both the scan enable signal 333 and the scan direction control signal 334 are set to be "1", the new scan enable signal 336 has a value of "1" and a multi-bit flip-flop using the new scan enable signal 336 as its scan enable signal performs a scan shift operation in the normal scan shift direction. When both the scan enable signal 333 and the scan direction control signal 334 are set to be "1" and "0", respectively, the new scan enable signal 336 has a value of "0" and a multi-bit flip-flop using the new scan enable signal 336 as its scan enable signal performs a scan shift operation in a direction opposite to the normal scan shift direction.

Figure 4A:
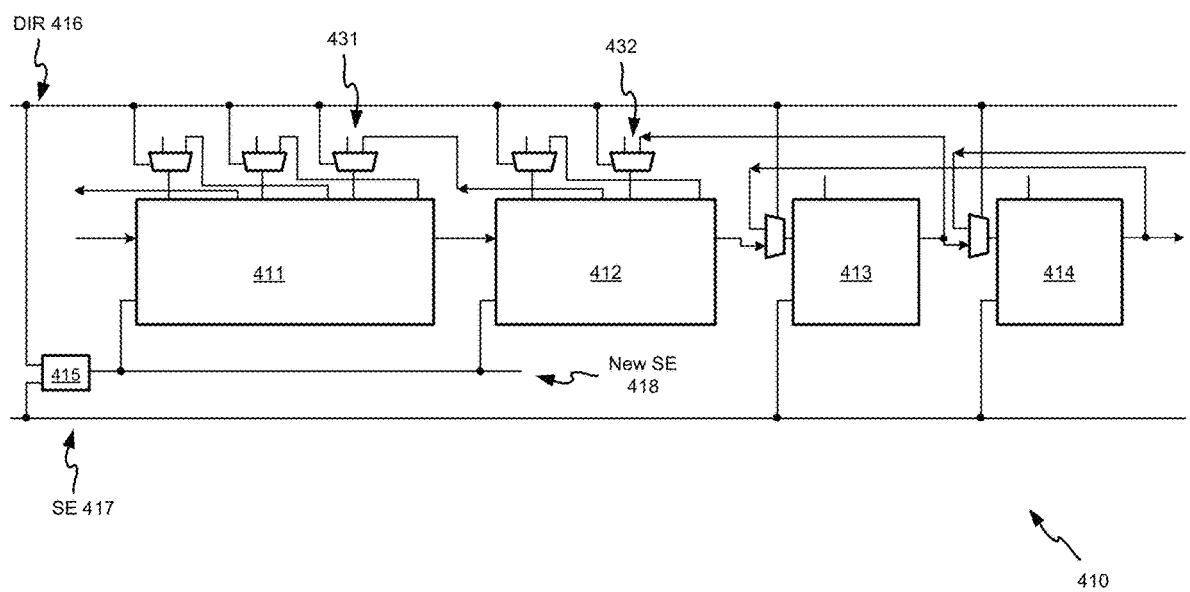
FIG. 4A illustrates an example of a scan chain comprising both single-bit flip-flops and multi-bit flip-flops, wherein an scan input and a scan enable input of each of the single-bit flip-flops are coupled to an output of a multiplexer and a scan enable signal, respectively, and a selection input of the multiplexer is coupled to a scan direction control signal.

A scan chain may comprise both single-bit flip-flops and multi-bit flip-flops. FIG. 4A illustrates an example of such a scan chain 410. The scan chain 410 comprises a three-bit flip-flop 411, a two-bit flip-flop 412, and two single-bit flip-flops 413 and 414. A multiplexer 431 for the last bit of the three-bit flip-flop 411 receives, as one of its two input signals, a signal from the output of the first bit of the two-bit flip-flop 412. A multiplexer 432 for the last bit of the two-bit flip-flop 412 receives, as one of its two input signals, a signal from the output of the single-bit flip-flop 413. New scan enable signal generation circuitry 415 is configured to generate, based on a scan direction control signal 416 and a scan enable signal 417 for the scan chain 410, a new scan enable signal 418 for the three-bit flip-flop 411, the two-bit flip-flop 412, and any other multi-bit flip-flops on the scan chain 410. The two single-bit flip-flops 413 and 414 still use the original scan enable signal 417. In this architecture, the scan chain 410 performs a capture operation when both the scan enable signal 417 and the scan direction control signal 416 are set to be "0", a scan shift operation in the normal scan shift direction when the scan enable signal 417 and the scan direction control signal 416 are set to be "1" and "0", respectively, and a scan shift operation in a reverse direction when both the scan enable signal 417 and the scan direction control signal 416 are set to be "1".

Figure 4B:
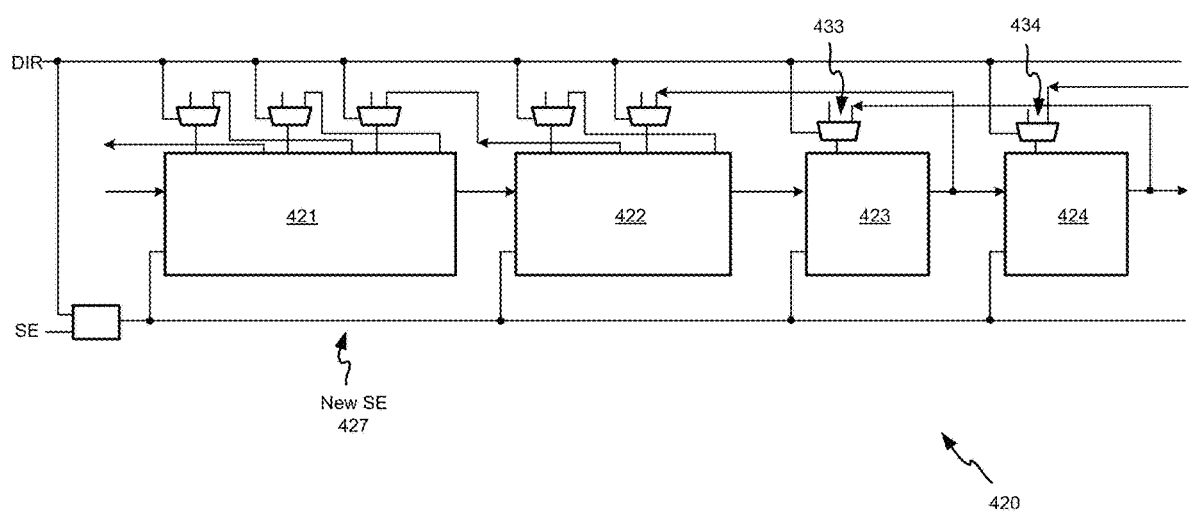
FIG. 4B illustrates an example of a scan chain comprising both single-bit flip-flops and multi-bit flip-flops, wherein a data input and a scan enable input of each of the one or more single-bit flip-flops are coupled to an output of a multiplexer and the new scan enable signal, respectively, and a selection input of the multiplexer is coupled to the scan direction control signal.

FIG. 4B illustrates another example of a scan chain 420 comprising both single-bit flip-flops and multi-bit flip-flops. Like the scan chain 410, the scan chain 420 comprises a three-bit flip-flop 421, a two-bit flip-flop 422, and two single-bit flip-flops 423 and 424. Unlike the scan chain 410, a multiplexer (433/434) for each of the two single-bit flip-flops 423 and 424 is coupled to the data input of the corresponding single-bit flip-flop, rather than the scan input. As such, the two single-bit flip-flops 423 and 424 also use the same new scan enable signal 427 for their scan enable inputs as the three-bit flip-flop 421 and the two-bit flip-flop 422.

Figure 5:
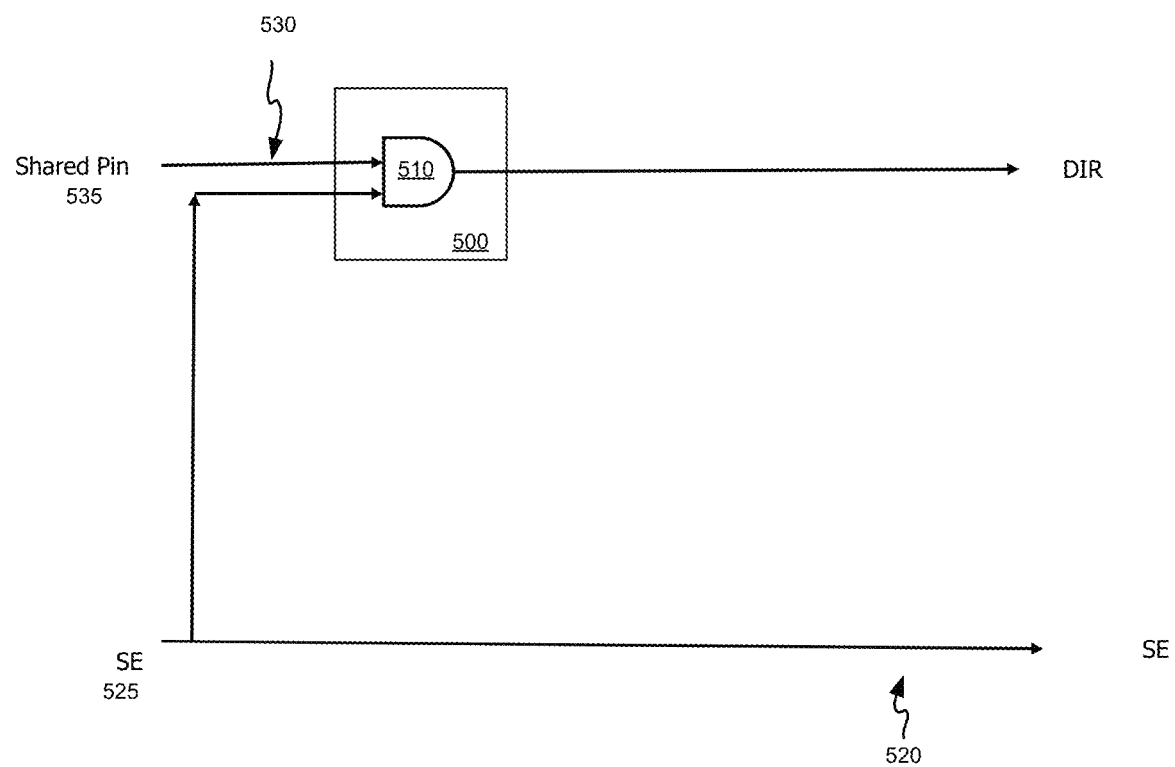
FIG. 5 illustrates an example of pin-sharing circuitry which enables using an existing input pin for functional circuitry to deliver the scan direction control signal according to various embodiments of the disclosed technology.

As FIGS. 2, 3A-C and 4A-B show, scan chains in a circuit need two signals, a scan enable signal and a scan direction control signal, to control shift operations in two directions. If the tester supplies the two dynamically changed signals during a manufacture test, an extra test input pin (port) is needed for the scan direction control signal compared to a traditional setup. It is advantageous to eliminate such a need. FIG. 5 illustrates an example of pin-sharing circuitry 500 which enables using an existing input pin for functional circuitry to deliver the scan direction control signal according to various embodiments of the disclosed technology. The pin-sharing circuitry 500 comprises an AND gate 510 which receives a scan enable signal 520 from a scan enable input pin 525 and a scan direction control signal 530 from a functional signal input pin 535. During a scan shift operation, in either a normal scan shift direction or a reverse scan shift direction, the scan enable signal 520 is set to be "1" and thus the scan direction control signal 530 can pass through the AND gate 510. During a scan capture operation, the scan enable signal 520 is set to be "0" and thus any signal at the functional signal input pin 535 is blocked by the AND gate 510 while the output of the AND gate 510 is set at "0", allowing multi-bit flip-flops and single-bit flip-flops that are configured like those in FIG. 4B to capture signals from the functional circuitry.

Figure 6A:
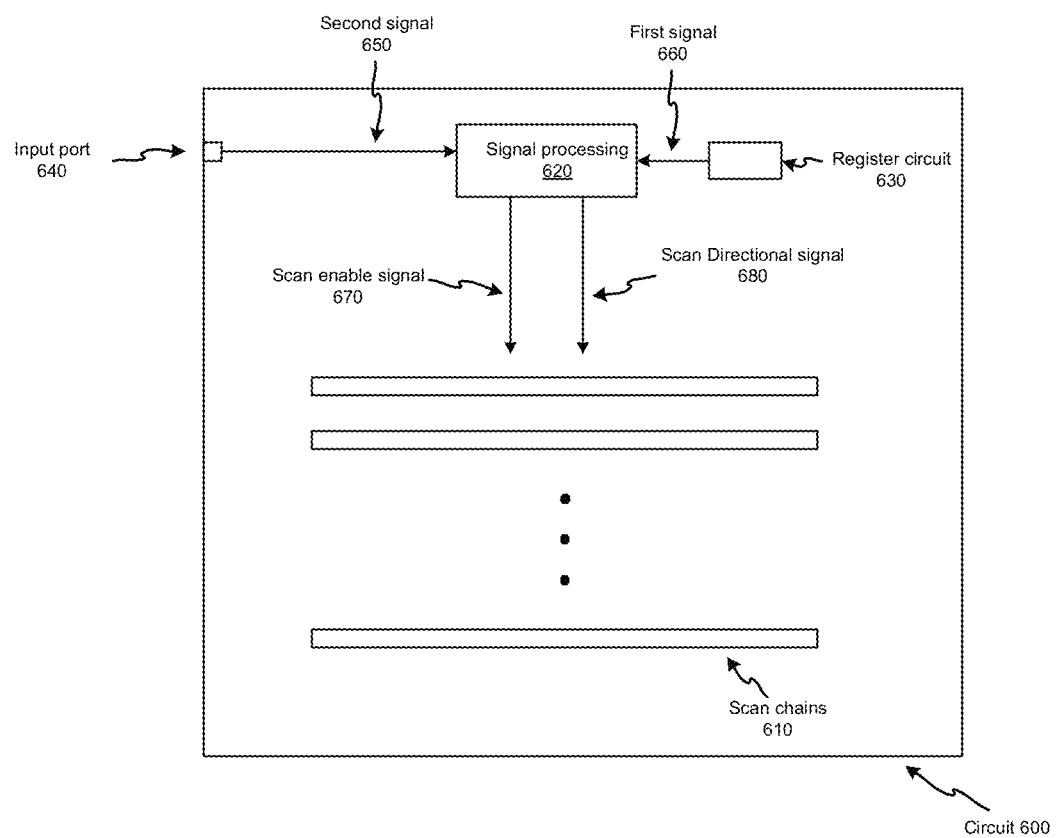
FIG. 6A illustrates an example of a block diagram of a circuit using a dynamically changed signal and a stored signal to generate a scan enable signal and a scan direction control signal for controlling bi-directional scan shifting according to various examples of the disclosed technology.

Another approach to reduce the number of test-dedicated inputs pins is using a dynamically changed signal and a stored signal to generate a scan enable signal and a scan direction control signal for controlling bi-directional scan shifting according to various examples of the disclosed technology. FIG. 6A illustrates an example of a block diagram of a circuit 600 using such an approach. The circuit 600 comprises a plurality of scan chains 610, a signal processing circuit 620, a register circuit 630, and an input port 640. The plurality of scan chains 610 can be configured to perform scan shifting in two opposite directions: left and right. The register circuit 630 can store a first signal 660. The first signal 660 may be stored as a single bit in the register circuit 630 or as a plurality of bits in the register circuit 630. The register circuit 630 can be a single bit register or a multi-bit register. The register circuit 630 can also be used to store other information in addition to the first signal. The first signal 660 determines whether the plurality of scan chains 610 operate in a first mode or a second mode. In the first mode, the plurality of scan chains 610 is configured to perform, based on a second signal 650 received from the input port 640 which can be dynamically changed during a test, either scan shifting in a first direction in the two opposite directions or scan capturing during a test. In the second mode, the plurality of scan chains 610 is configured to perform, based on the second signal 650, scan shifting in the first direction (e.g, left) or the second direction (e.g., right) in the two opposite directions. The second signal 650 may be supplied by a tester. The signal processing circuit 620 is configured to generate a scan enable signal 670 and a scan direction control signal 680 based on the first signal 660 and the second signal 650. The scan enable signal 670 can be used to control whether the scan cells on the plurality of scan chains 610 receive input signals from outputs of their neighboring scan cells for scan shifting or the functional circuit for scan capturing during either a test or for functional operation of the circuit 600. The scan direction control signal 680 can be used to control the shift direction of the plurality of scan chains 610 during a shift operation either in the first mode or the second mode.

Figure 6B:
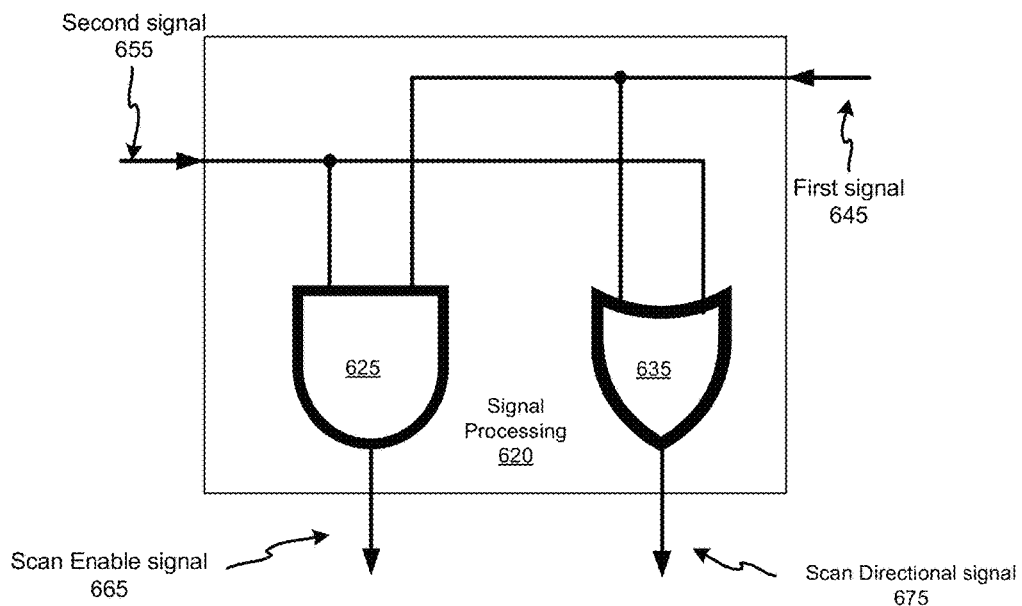
FIG. 6B illustrates an example of a circuit diagram of the signal processing circuit and an associated truth table according to various examples of the disclosed technology.

FIG. 6B illustrates an example of a circuit diagram of the signal processing circuit 620 and an associated truth table 605 according to various examples of the disclosed technology. The signal processing circuit 620 comprises an AND gate 625 and an OR gate 635. The AND gate 625 combines a first signal 645 and a second signal 655 to generate a scan enable signal 665; and the OR gate 635 combines the first signal 645 and the second signal 655 to generate a scan direction control signal 675. As the table 605 shows, scan chains will operate in the first mode when the first signal 645 is 1 and in the second mode when the first signal 645 is 0. In the first mode, the scan enable signal 665 follows the second signal 655: the scan chains will perform scan capturing when the second signal 655 is 1 and scan shifting in one direction (e.g., left) when the second signal 655 is 0. It should be noted that the AND gate 625 may be replaced by an NAND gate. In this case, the scan chains will perform scan capturing when the second signal 655 is 0 and scan shifting in one direction (e.g., left) when the second signal 655 is 1. In the second mode, the scan chains always perform scan shifting because the scan enable signal 665 remains at 0 (or 1 if the AND gate 625 may be replaced by an NAND gate) and the scan direction control signal 675 follows the second signal 655: the scan chains perform scan shifting to, for example, left when the second signal 655 is 1 and right when the second signal 655 is 0. If the OR gate 635 is replaced by a NOR gate, the scan chains perform scan shifting to left when the second signal 655 is 1 and right when the second signal 655 is 0 in the second mode.

It should be noted that whether operating in the first mode and the second mode can be set before a test while the scan enable signal 665 in the first mode and the scan direction control signal 675 in the second mode need to be changed during a test: scan shift—scan capture for the former and shift left—shift right for the latter. Accordingly, the first signal 645, which determines the mode, may be stored in a register while the second signal 230 is supplied through an input pin, which can be dynamically changeable during a test. Before a test session, the first signal 645 may be delivered using a reconfigurable scan network conforming to IEEE 1687-2014 (IJTAG).

Figure 7:
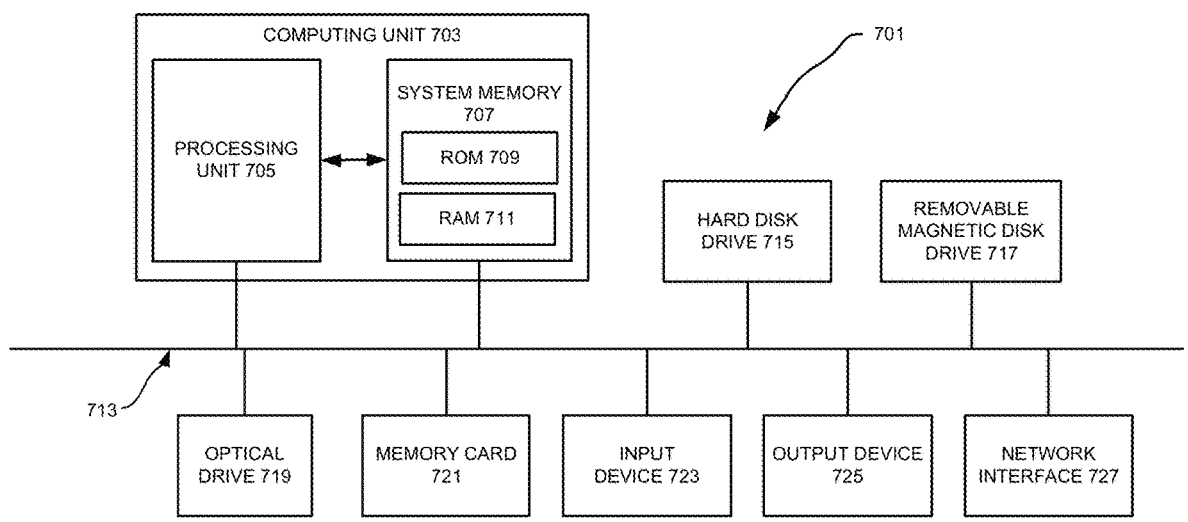
FIG. 7 illustrates a programmable computer system with which various embodiments of the disclosed technology may be employed.

Various examples of the disclosed technology may be implemented through the execution of software instructions by a computing device, such as a programmable computer. For example, the computing device may be caused to perform a method for creating test circuitry in a circuit design for testing a chip fabricated according to the circuit design. Accordingly, FIG. 7 shows an illustrative example of a computing device 701. As seen in this figure, the computing device 701 includes a computing unit 703 with a processing unit 705 and a system memory 707. The processing unit 705 may be any type of programmable electronic device for executing software instructions, but it will conventionally be a microprocessor. The system memory 707 may include both a read-only memory (ROM) 709 and a random access memory (RAM) 711. As will be appreciated by those of ordinary skill in the art, both the read-only memory (ROM) 709 and the random access memory (RAM) 711 may store software instructions for execution by the processing unit 705.

The processing unit 705 and the system memory 707 are connected, either directly or indirectly, through a bus 713 or alternate communication structure, to one or more peripheral devices. For example, the processing unit 705 or the system memory 707 may be directly or indirectly connected to one or more additional memory storage devices, such as a "hard" magnetic disk drive 715, a removable magnetic disk drive 717, an optical disk drive 719, or a flash memory card 721. The processing unit 705 and the system memory 707 also may be directly or indirectly connected to one or more input devices 723 and one or more output devices 725. The input devices 723 may include, for example, a keyboard, a pointing device (such as a mouse, touchpad, stylus, trackball, or joystick), a scanner, a camera, and a microphone. The output devices 725 may include, for example, a monitor display, a printer and speakers. With various examples of the computer 701, one or more of the peripheral devices 715-725 may be internally housed with the computing unit 703. Alternately, one or more of the peripheral devices 715-725 may be external to the housing for the computing unit 703 and connected to the bus 713 through, for example, a Universal Serial Bus (USB) connection.

With some implementations, the computing unit 703 may be directly or indirectly connected to one or more network interfaces 727 for communicating with other devices making up a network. The network interface 727 translates data and control signals from the computing unit 703 into network messages according to one or more communication protocols, such as the transmission control protocol (TCP) and the Internet protocol (IP). Also, the interface 727 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 701 is illustrated as an example only, and it is not intended to be limiting. Various embodiments of the disclosed technology may be implemented using one or more computing devices that include the components of the computer 701 illustrated in FIG. 7, which include only a subset of the components illustrated in FIG. 7, or which include an alternate combination of components, including components that are not shown in FIG. 7. For example, various embodiments of the disclosed technology may be implemented using a multi-processor computer, a plurality of single and/or multiprocessor computers arranged into a network, or some combination of both.

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A circuit, comprising:
    a scan chain comprising one or more multi-bit flip-flops;
    a plurality of multiplexers, each of the plurality of multiplexers being associated with a particular bit of the one or more multi-bit flip-flops with an output of the each of the plurality of multiplexers coupled to a data input of the particular bit, the each of the plurality of multiplexer configured to select, based on a scan direction control signal, between an input signal from functional circuitry of the circuit and an input signal from a data output of a bit of the scan chain immediately following the particular bit in a normal scan shift direction; and new scan enable signal generation circuitry configured to generate a new scan enable signal for the one or more multi-bit flip-flops based on the scan direction control signal and a scan enable signal for the scan chain, wherein the one or more multi-bit flip-flops perform a capture operation when both the scan enable signal and the new scan enable signal are set to be a first logic value and the scan direction control signal is set to be a second logic value, a scan shift operation in the normal scan shift direction when both the scan enable signal and the new scan enable signal are set to be a third logic value which is opposite to the first logic value and the scan direction control signal is set to be the second logic value, and a scan shift operation in a direction opposite to the normal scan shift direction when the scan enable signal and the new scan enable signal are set to be the third logic value and the first logic value, respectively and the scan direction control signal is set to be a fourth logic value which is opposite to the second logic value.

2. The circuit recited in claim 1, wherein the new scan enable signal generation circuitry comprises an AND gate, and wherein the first logic value is opposite to the second signal.

3. The circuit recited in claim 1, wherein the new scan enable signal generation circuitry comprises an AND gate and an inverter, an input and an output of the inverter being coupled to the scan direction control signal and an input of the AND gate, respectively, and wherein the first logic value is the same as the second signal.

4. The circuit recited in claim 1, wherein the new scan enable signal generation circuitry comprises an XOR gate and an inverter, an input and an output of the inverter being coupled to the scan enable signal and an input of the XOR gate, respectively, and wherein the first logic value is opposite to the second logic value.

5. The circuit recited in claim 1, wherein the scan chain further comprises one or more single-bit flip-flops, an scan input and a scan enable input of each of the one or more single-bit flip-flops being coupled to an output of a multiplexer and the scan enable signal, respectively, and a selection input of the multiplexer being coupled to the scan direction control signal.

6. The circuit recited in claim 1, wherein the scan chain further comprises one or more single-bit flip-flops, a data input and a scan enable input of each of the one or more single-bit flip-flops being coupled to an output of a multiplexer and the new scan enable signal, respectively, and a selection input of the multiplexer being coupled to the scan direction control signal.

7. The circuit recited in claim 1, further comprising:
pin-sharing circuitry with two inputs coupled to a input pin for the functional circuitry and the scan enable signal, respectively, the pin-sharing circuitry configured to output a particular logic value during the capture operation and to allow a signal from the input pin for the functional circuitry pass through as the scan direction control signal during a scan shift operation.

8. The circuit recited in claim 7, wherein the pin-sharing circuitry comprises an AND gate.

9. The circuit recited in claim 1, further comprising:
a register configured to store a first signal, the first signal determining whether the plurality of scan chains operate in a first mode or a second mode, wherein the scan chain operating in the first mode is configured to perform, based on a second signal, either the scan shift operation in the normal scan shift direction or the capture operation, and wherein the scan chain operating in the second mode is configured to perform, based on the second signal, the scan shift operation in either the normal scan shift direction or the direction opposite to the normal scan shift direction.

10. The circuit recited in claim 9, wherein the first signal is delivered to the register through a network conforming to IEEE 1687-2014 (IJTAG) and the second signal is supplied through an input pin of the circuit.

11. One or more non-transitory computer-readable media storing computer-executable instructions for causing a computer to perform a method for creating test circuitry in a circuit design for testing a chip fabricated according to the circuit design, the test circuitry comprising:
a scan chain comprising one or more multi-bit flip-flops;
a plurality of multiplexers, each of the plurality of multiplexers being associated with a particular bit of the one or more multi-bit flip-flops with an output of the each of the plurality of multiplexers coupled to a data input of the particular bit, the each of the plurality of multiplexer configured to select, based on a scan direction control signal, between an input signal from functional circuitry of the circuit and an input signal from a data output of a bit of the scan chain immediately following the particular bit in a normal scan shift direction; and new scan enable signal generation circuitry configured to generate a new scan enable signal for the one or more multi-bit flip-flops based on the scan direction control signal and a scan enable signal for the scan chain, wherein the one or more multi-bit flip-flops perform a capture operation when both the scan enable signal and the new scan enable signal are set to be a first logic value and the scan direction control signal is set to be a second logic value, a scan shift operation in the normal scan shift direction when both the scan enable signal and the new scan enable signal are set to be a third logic value which is opposite to the first logic value and the scan direction control signal is set to be the second logic value, and a scan shift operation in a direction opposite to the normal scan shift direction when the scan enable signal and the new scan enable signal are set to be the third logic value and the first logic value, respectively and the scan direction control signal is set to be a fourth logic value which is opposite to the second logic value.

12. The one or more non-transitory computer-readable media recited in claim 11, wherein the new scan enable signal generation circuitry comprises an AND gate, and wherein the first logic value is opposite to the second signal.

13. The one or more non-transitory computer-readable media recited in claim 11, wherein the new scan enable signal generation circuitry comprises an AND gate and an inverter, an input and an output of the inverter being coupled to the scan direction control signal and an input of the AND gate, respectively, and wherein the first logic value is the same as the second signal.

14. The one or more non-transitory computer-readable media recited in claim 11, wherein the new scan enable signal generation circuitry comprises an XOR gate and an inverter, an input and an output of the inverter being coupled to the scan enable signal and an input of the XOR gate, respectively, and wherein the first logic value is opposite to the second logic value.

15. The one or more non-transitory computer-readable media recited in claim 11, wherein the scan chain further comprises one or more single-bit flip-flops, an scan input and a scan enable input of each of the one or more single-bit flip-flops being coupled to an output of a multiplexer and the scan enable signal, respectively, and a selection input of the multiplexer being coupled to the scan direction control signal.

16. The one or more non-transitory computer-readable media recited in claim 11, wherein the scan chain further comprises one or more single-bit flip-flops, a data input and a scan enable input of each of the one or more single-bit flip-flops being coupled to an output of a multiplexer and the new scan enable signal, respectively, and a selection input of the multiplexer being coupled to the scan direction control signal.

17. The one or more non-transitory computer-readable media recited in claim 11, wherein the test circuitry further comprises:
    pin-sharing circuitry with two inputs coupled to a input pin for the functional circuitry and the scan enable signal, respectively, the pin-sharing circuitry configured to output a particular logic value during the capture operation and to allow a signal from the input pin for the functional circuitry pass through as the scan direction control signal during a scan shift operation.

18. The one or more non-transitory computer-readable media recited in claim 17, wherein the pin-sharing circuitry comprises an AND gate.

19. The one or more non-transitory computer-readable media recited in claim 11, wherein the test circuitry further comprises:
    a register configured to store a first signal, the first signal determining whether the plurality of scan chains operate in a first mode or a second mode, wherein the scan chain operating in the first mode is configured to perform, based on a second signal, either the scan shift operation in the normal scan shift direction or the capture operation, and wherein the scan chain operating in the second mode is configured to perform, based on the second signal, the scan shift operation in either the normal scan shift direction or the direction opposite to the normal scan shift direction.

20. The one or more non-transitory computer-readable media recited in claim 19, wherein the first signal is delivered to the register through a network conforming to IEEE 1687-2014 (IJTAG) and the second signal is supplied through an input pin of the circuit.

\* \* \* \* \*